(12) United States Patent
Choi et al.

(10) Patent No.: US 6,183,563 B1
(45) Date of Patent: Feb. 6, 2001

(54) APPARATUS FOR DEPOSITING THIN FILMS ON SEMICONDUCTOR WAFERS

(75) Inventors: Won-sung Choi; Kyu-un Oh, both of Kyungki-do (KR)

(73) Assignee: IPS Ltd. (KR)

( * ) Notice: Under 35 U.S.C. 154(b), the term of this patent shall be extended for 0 days.

(21) Appl. No.: 09/313,765

(22) Filed: May 18, 1999

(30) Foreign Application Priority Data

May 18, 1998 (KR) .................................................. 98-17858

(51) Int. Cl.⁷ .................................................. C23C 16/00
(52) U.S. Cl. ..................................... 118/715; 204/298.15
(58) Field of Search ........................ 204/298.15; 118/715

(56) References Cited

U.S. PATENT DOCUMENTS

| | | | |
|---|---|---|---|
| 5,000,113 | * 3/1991 | Wang et al. | 118/723 E |
| 5,010,842 | * 4/1991 | Oda et al. | 118/723 |
| 5,522,932 | * 6/1996 | Wong et al. | 118/715 |
| 5,558,717 | * 9/1996 | Zhao et al. | 118/715 |
| 5,788,747 | * 8/1998 | Horiuchi et al. | 118/723 VE |
| 5,900,103 | * 5/1999 | Tomoyasu et al. | 156/345 |
| 5,906,683 | * 5/1999 | Chen et al. | 118/724 |
| 5,968,276 | * 10/1999 | Lei et al. | 118/723 R |

FOREIGN PATENT DOCUMENTS

2046723 * 2/1990 (JP) .

* cited by examiner

Primary Examiner—Jeffrie R. Lund
Assistant Examiner—Sylvia R. MacArthur
(74) Attorney, Agent, or Firm—Nixon & Vanderhye PC; Frank P. Presta

(57) ABSTRACT

An apparatus for depositing thin films on a semiconductor wafer. The thin film deposition apparatus includes a reactor block receiving a semiconductor wafer; a shower head plate covering the reactor block to maintain the internal pressure of the reactor block at a predetermined level; a reaction gas supply connected to the shower head plate, for supplying reaction gases; an inert gas supply connected to the shower head plate, for supplying an inert gas; an exhaust portion connected to the reactor block, for exhausting the gases out of the reactor block; and a diffusion plate installed in the shower head plate, having a plurality of passages connected to the source of inert gas supply, a plurality of nozzles connected to the passages, the inert gas sprayed through the nozzles lowering a wall of inert gas along the inner wall of the reactor block, and a plurality of spray holes, the reaction gases spread over the wafer through the spray holes.

7 Claims, 5 Drawing Sheets

APPARATUS FOR DEPOSITING THIN FILMS ON SEMICONDUCTOR WAFERS

BACKGROUND OF THE INVENTION

1. Field of the Invention

The present invention relates to an apparatus for depositing thin films on a semiconductor wafer.

2. Description of the Related Art

Referring to FIGS. 1 and 2, a conventional thin film deposition apparatus comprises a reactor 1, first and second pipes 2 and 3 through which first and second reaction gases are injected into the reactor 1, and an exhaust pipe 4 for exhausting the reaction gases from the reactor 1. Also, first and second valves 5 and 6 which are opened or closed by a controller (not shown) are connected to the fist and second pipes 2 and 3, respectively, and a pump 7 is installed in the exhaust pipe 4.

In the apparatus with the above structure, the controller closes the second valve 6 and opens the first valve 5, the first reaction gas is provided through the first valve 5 to the reactor 1, and then exhausted through the exhaust pipe 4 and the pump 7. Then, the controller closes the first valve 5 and opens the second valve 6, the second reaction gas is provided through the second valve 6 to the reactor 1, and then exhausted through the exhaust pipe 4 and the pump 7.

However, during a thin film deposition step, the reaction gases provided to the reactor are deposited over the entire inner wall of the reactor exposed to the reaction gases in addition to the wafer. Thus, a cleaning step for cleaning the inner wall of the reactor must be performed periodically.

Also, because the exhaust pipe 4 is installed at only one side of the reactor 1, the distribution of the reaction gases in the reactor 1, that is, between a part near the exhaust pipe 4 and another part far away from the exhaust pipe 4, is different. Such difference in distribution of the reaction gases in the reactor causes uneven distribution of the reaction gases on the wafer, thereby interfering with the laminar flow of the reaction gases over the wafer.

SUMMARY OF THE INVENTION

It is an object of the present invention to provide an apparatus for depositing thin films on a semiconductor wafer, in which the area of a part of a reactor exposed to reaction gases is reduced, making a cleaning cycle longer, and a laminar flow of the reaction gases can be ensured over the entire wafer.

To achieve the object of the present invention, there is provided an apparatus for depositing thin films on a semiconductor wafer, comprising: a reactor block receiving a semiconductor wafer; a shower head plate covering the reactor block to maintain the internal pressure of the reactor block at a predetermined level; a reaction gas supply for supplying reaction gases, the reaction gas supply connected to the shower head plate; an inert gas supply for supplying an inert gas, the inert gas supply connected to the shower head plate; an exhaust portion for exhausting the gases out of the reactor block, the exhaust portion connected to the reactor block; and a diffusion plate having a plurality of passages connected to the source of inert gas supply, a plurality of nozzles connected to the passages, the inert gas sprayed through the nozzles lowering a wall of inert gas along the inner wall of the reactor block, and a plurality of spray holes, the reaction gases spread over the wafer through the spray holes, the diffusion plate installed in the shower head plate.

Preferably, the passages are radially formed from the center of the diffusion plate, and the nozzles are formed along the outer circumference of the diffusion plate, being slanted toward the inner wall of the reactor block.

Preferably, the apparatus for depositing thin films on a semiconductor wafer further comprises a shield installed in the reactor block, such that the gas of inert gas is lowered along the inner wall of the shield.

Preferably, the apparatus for depositing thin films on a semiconductor wafer further comprises an exhaust means having an anti-flow cylinder, the wafer positioned above the anti-flow cylinder and an exhaust plate formed in the anti-flow cylinder, and the exhaust plate having at least three or more exhaust holes symmetrically arranged to be connected to the exhaust portion.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENT

Figure 1:
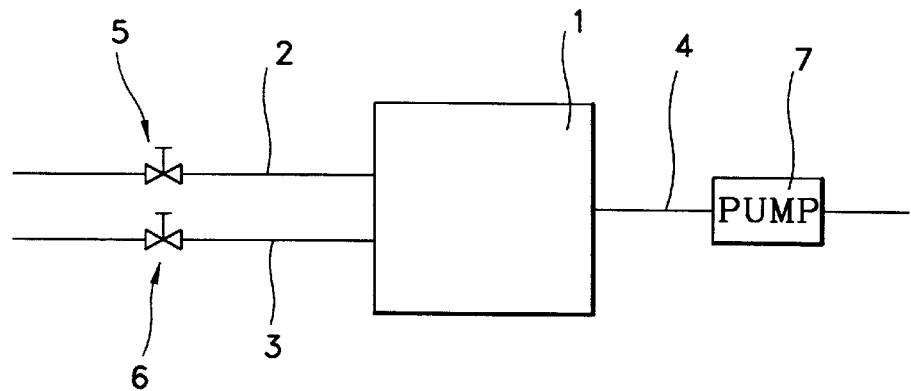
FIG. 1 is a schematic view of a conventional thin film deposition apparatus.
Figure 2:
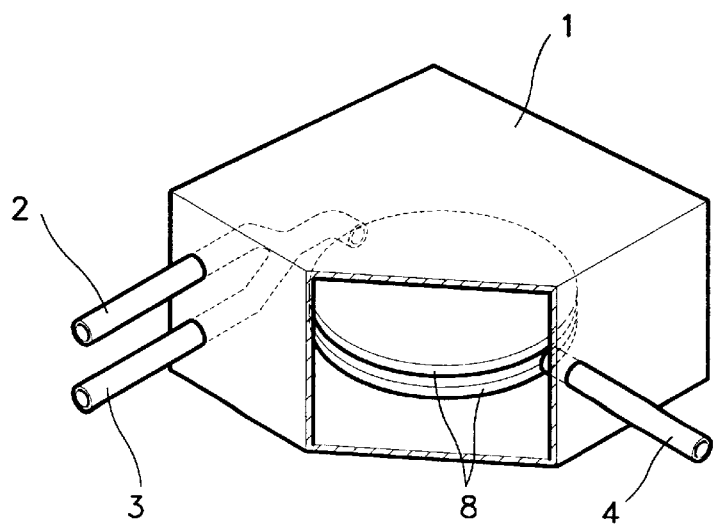
FIG. 2 is a perspective view of the reactor shown in FIG. 1.
Figure 3:
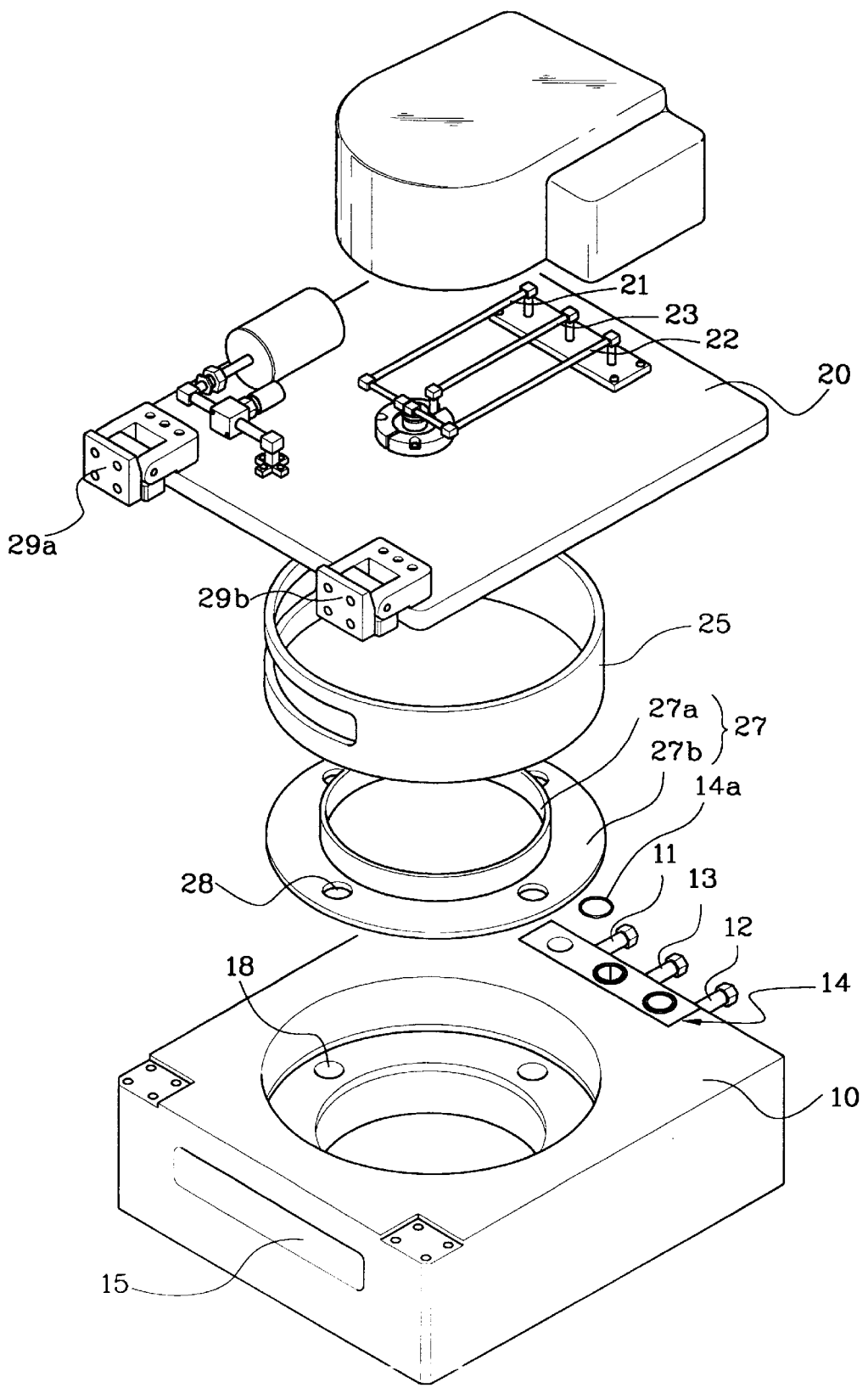
FIG. 3 is an exploded perspective view of a thin film deposition apparatus according to the present invention.
Figure 4:
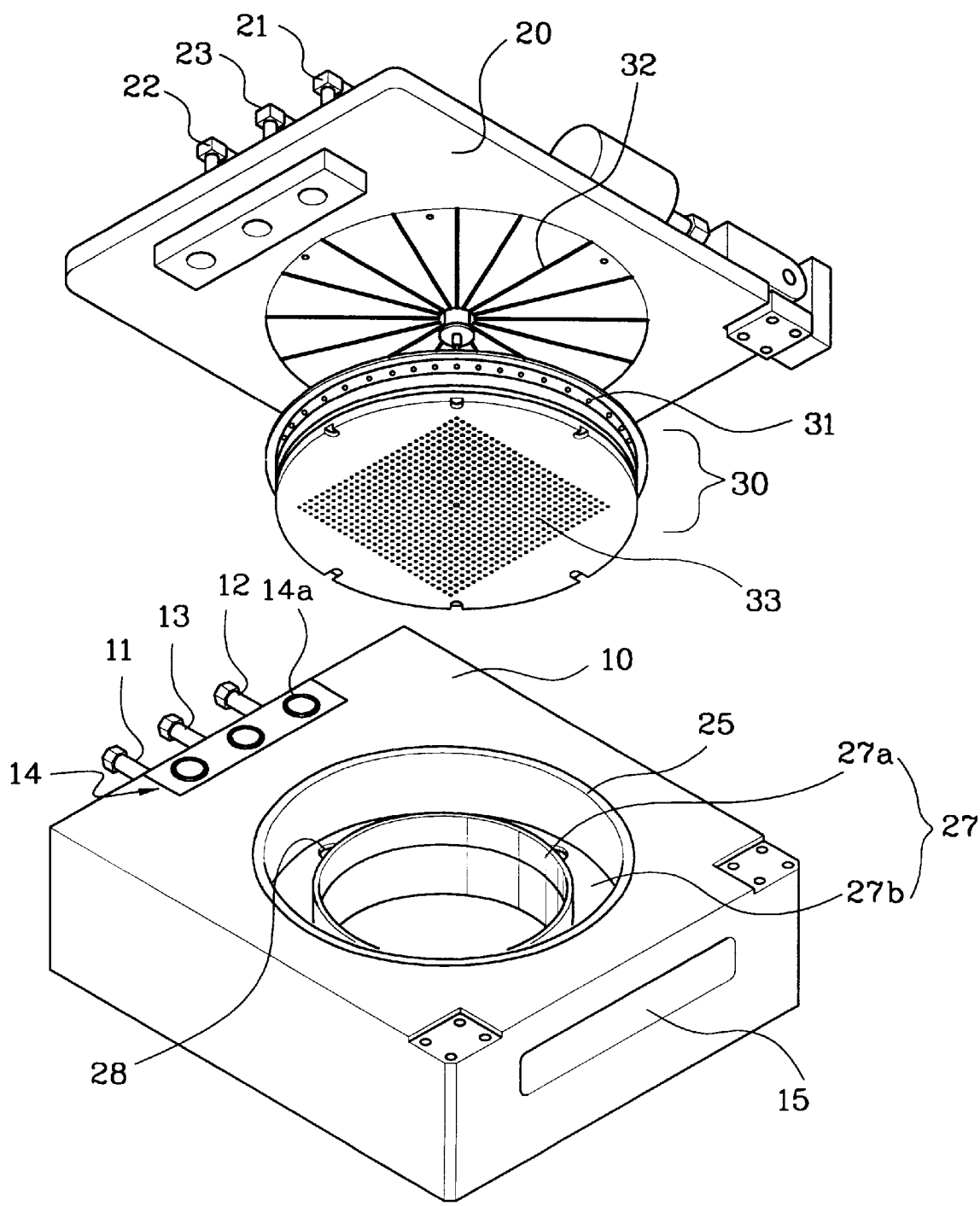
FIG. 4 is a perspective view of the shower head plate and the diffusion plate of FIG. 3.
Figure 5:
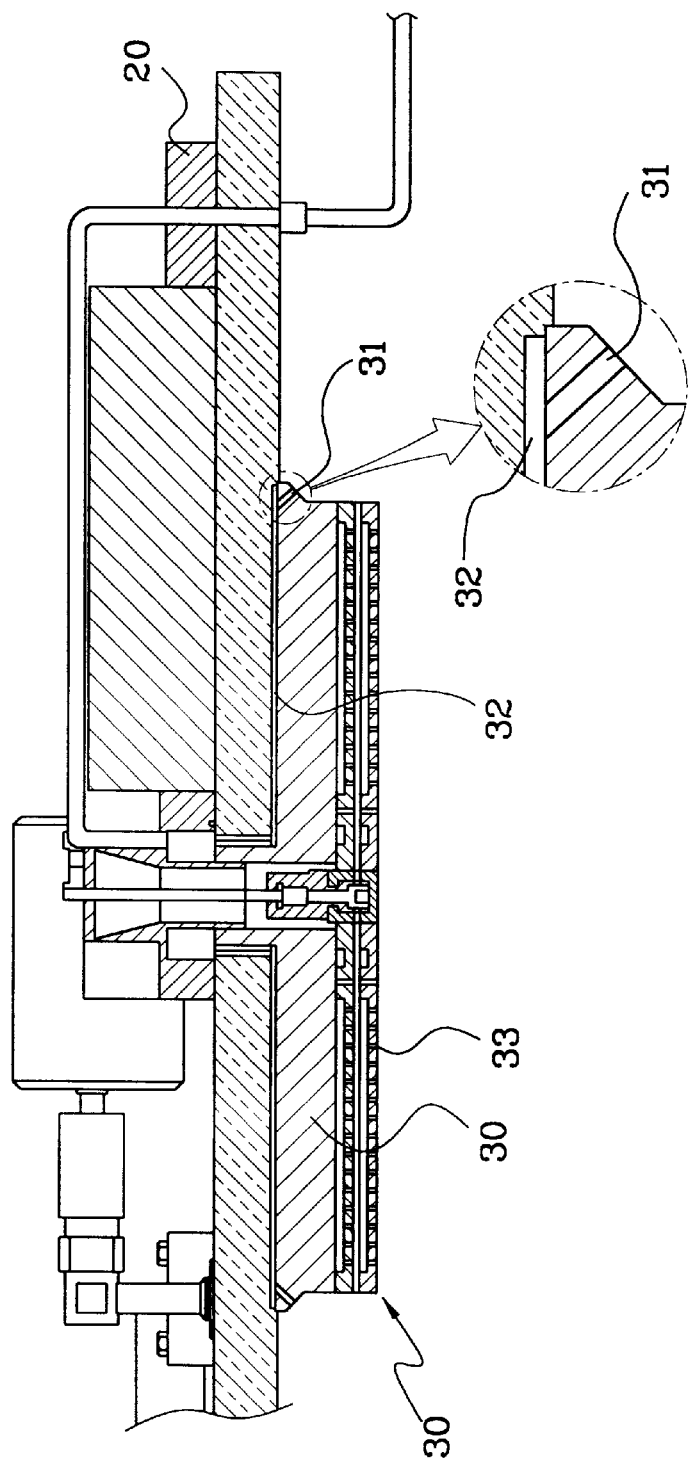
FIG. 5 is a vertical sectional view of the shower head plate shown in FIG. 3.
Figure 6:
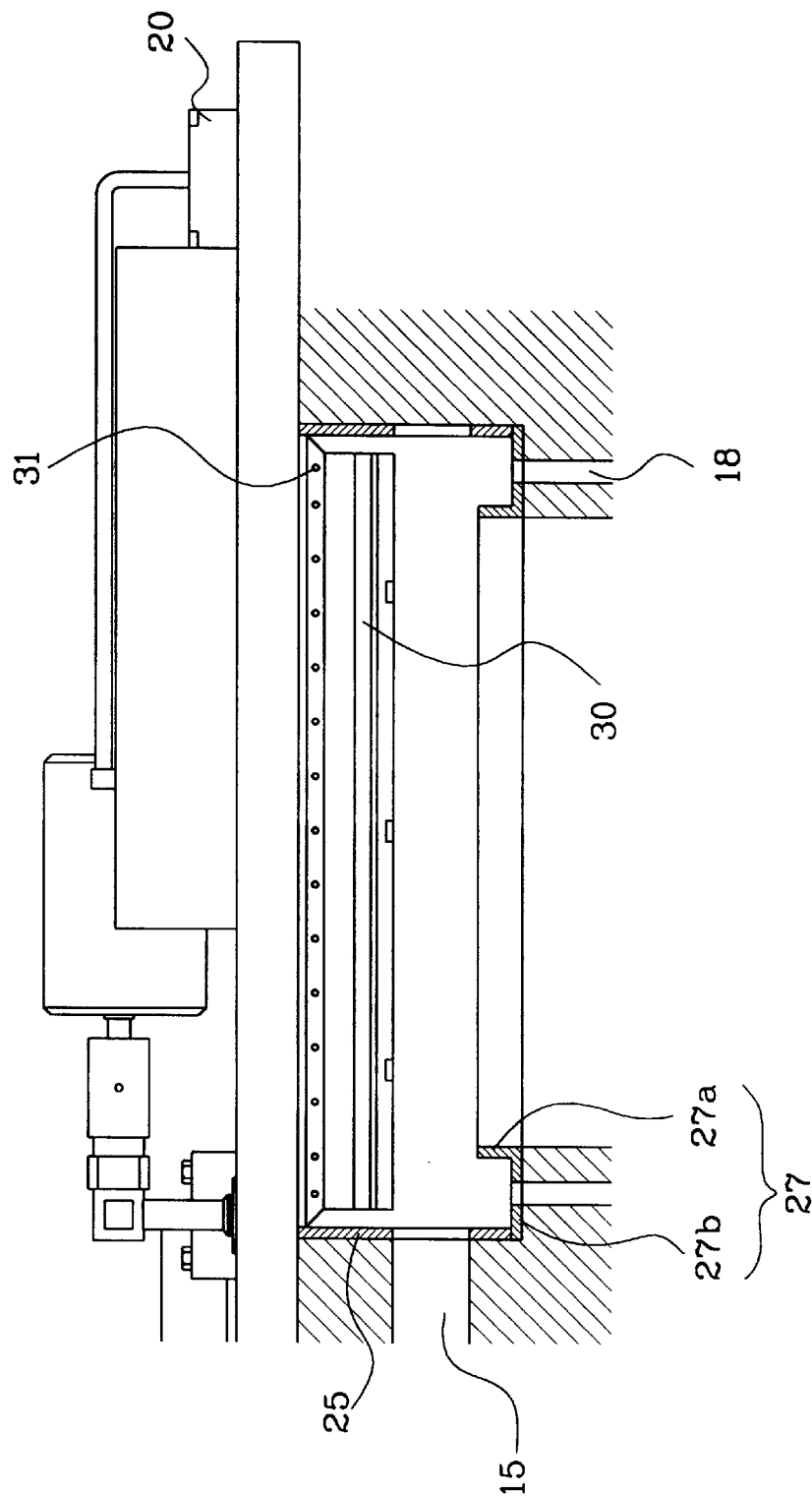
FIG. 6 is a vertical sectional view of the reactor block shown in FIG. 3.

Referring to FIGS. 3 and 4, a thin film deposition apparatus according to the present invention comprises a reactor block 10 for receiving a semiconductor wafer (not shown), and a shower head plate 20 hinged by hinges 29a and 29b. The shower head plate 20 covers the reactor block 10 to maintain the internal pressure of the reactor block 10 to a predetermined level. Also, a diffusion plate 30 through which reaction gases are sprayed is installed in the shower head plate 20, and the diffusion plate 30 is placed in the reactor block 10 when the reactor block 10 is covered by the shower head plate 20.

First and second pipes 11 and 12 connected to a reaction gas supply (not shown), through which the reaction gases are supplied to the reactor block 10, and a third pipe 13 connected to an inert gas supply (not shown), are connected to the reactor block 10. The pipes 11, 12 and 13 are connected respectively to first, second and third connection pipes 21, 22 and 23 installed in the shower head plate 20 through a connection portion 14. Also, O-rings 14a are inserted in the connection portion 14 such that the pipes 11, 12 and 13 of the reactor block 10 are effectively coupled to the connection pipes 21, 22 and 23 when the hinged shower head plate 20 swings on the hinges 29a and 29b to cover the reactor block 10, and are efficiently disconnected when the shower head plate 20 is apart from the reactor block 10. Also, three or more reactor exhaust holes 18 through which the inert gas or/and reaction gases flow are symmetrically formed in the reactor block 10.

The diffusion plate 30 comprises a plurality of passages 32 radiating in all directions, a plurality of nozzles 31 that are formed along the outer circumference of the diffusion plate 30, being connected with the passages 32, and are slanted toward the inner wall of the reactor block 10, and many spray holes 33 that are evenly distributed on the surface of the diffusion plate 30 and are connected to the first and second pipes 21 and 22. The inert gas is sprayed over the inner wall of the reactor block 10 through the third pipe 13, the third connection pipe 23, the passages 32 and the nozzles 31 in sequence, thus lowering a wall of gas.

Also, a shield 25 serving to minimize the area exposed to the reaction gases is detachably installed in the reactor block 10. The shield 25 is formed of alumina, aluminum or stainless steel, and is installed very closely to the inner wall of the reactor block 10. When the shield 25 is installed in the reactor block 10, a wall of inert gas is lowered along the inner wall of the shield 25.

Also, an exhaust means 27 for a laminar flow of the reaction gases over a wafer is detachably installed in the reactor block 10. The exhaust means 27 comprises an exhaust plate 27b as the bottom of the shield 25, and an anti-flow cylinder 27a formed around the inner circumference of the exhaust plate 27b. Here, the exhaust plate 27b has exhaust holes 28 connected to an exhaust portion (not show) connected to the reactor block 10, corresponding to the reactor exhaust holes 18, through which the inert gas and the reaction gases can be discharged. The exhaust means 27 is formed of alumina, aluminum or stainless steel. Preferably, the exhaust plate 27b having the exhaust holes 28 is placed below a wafer at a separation distance of 30–50 mm.

In the thin film deposition apparatus, when a wafer transferred through a wafer transfer hole 15 is positioned above the anti-flow cylinder 27a, the reaction gases flow through the first pipe 11 and the first connection pipe 21, or the second pipe 12 and the second connection pipe 22, and are finally sprayed into the reactor block 10 through spray holes 33 of the diffusion plate 30. Also, the inert gas flows through the third pipe 13, the third connection pipe 23 and the passages 32 in sequence and is then sprayed into the reactor block 10 through the nozzles 31, lowering a wall of inert gas along the inner wall of the shield 25. The wall of inert gas prevents the reaction gases from contacting the shield 25.

Here, the anti-flow cylinder 27a and the evenly distributed spray holes 33 allow a laminar flow of reaction gases over a wafer, and the reaction gases and the inert gas sprayed by the diffusion plate 30 into the reactor block 10 are discharged through the symmetrically placed exhaust holes 28 and the reactor exhaust holes 18.

In the thin film deposition apparatus according to the present invention, a wall of inert gas is lowered along the inner wall of the shield installed in the reactor block, so that the deposition of the reaction gases on the reactor block or the shield is prevented, thereby elongating the cleaning cycle.

Also, a laminar flow of reaction gases over the wafer placed above the anti-flow cylinder is achieved and the reaction gases and the inert gas are evenly discharged through the symmetrically arranged discharge holes, thereby allowing different gas to continuously flow in.

What is claimed is:

1. An apparatus for depositing thin films on a semiconductor wafer, comprising:
   a reactor block receiving a semiconductor wafer, said reactor block having an inner wall;
   a shower head plate covering the reactor block to maintain internal pressure in the reactor block at a predetermined level;
   a reaction gas supply for supplying reaction gases, the reaction gas supply connected to the shower head plate;
   an inert gas supply for supplying an inert gas, the inert gas supply connected to the shower head plate;
   an exhaust portion for exhausting the reaction and inert gases out of the reactor block, the exhaust portion connected to the reactor block; and
   a diffusion plate having a plurality of passages connected to the inert gas supply, a plurality of nozzles connected to the passages, the inert gas sprayed through the nozzles creating a wall of inert gas along the inner wall of the reactor block, and a plurality of spray holes, the reaction gases spread over the wafer through the spray holes, the diffusion plate installed in the shower head plate and having an outer circumference; the nozzles being formed along the outer circumference of the diffusion plate and being slanted toward the inner wall of the reactor block to prevent the deposition of reaction gases thereon.

2. The apparatus of claim 1, wherein the passages are radially formed from the center of the diffusion plate.

3. The apparatus of claim 1, further comprising a shield with an inner wall installed in the reactor block, such that the gas of inert gas is lowered along the inner wall of the shield.

4. The apparatus of claim 3, wherein the shield is formed of at least one material selected from the group consisting of alumina, aluminum and stainless steel.

5. The apparatus of claim 1, further comprising an exhaust means having an anti-flow cylinder, the wafer positioned above the anti-flow cylinder and an exhaust plate formed in the anti-flow cylinder, and the exhaust plate having at least three exhaust holes symmetrically arranged to be connected to the exhaust portion.

6. The apparatus of claim 5, wherein the exhaust plate of the exhaust means is lower than the height of the wafer by 30–50 mm.

7. The apparatus of claim 1, further comprising O-rings inserted in the shower head plate or the reactor block, for allowing a safe connection and disconnection between pipes installed in the shower head plate and pipes installed in the reactor block.

* * * * *